United States Patent
Huston et al.

(10) Patent No.: US 10,932,380 B2
(45) Date of Patent: Feb. 23, 2021

(54) SYSTEMS AND METHODS FOR DISPLAY INTEGRATION

(71) Applicant: Microsoft Technology Licensing, LLC, Redmond, WA (US)

(72) Inventors: David John Huston, Seattle, WA (US); James Michael Bonicatto, Seattle, WA (US); Kenneth Charles Boman, Duvall, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 308 days.

(21) Appl. No.: 15/249,991

(22) Filed: Aug. 29, 2016

(65) Prior Publication Data

US 2018/0063974 A1    Mar. 1, 2018

(51) Int. Cl.
*H05K 5/02* (2006.01)
*G06F 1/16* (2006.01)
*H05K 5/03* (2006.01)

(52) U.S. Cl.
CPC ......... *H05K 5/0217* (2013.01); *G06F 1/1637* (2013.01); *H05K 5/03* (2013.01)

(58) Field of Classification Search
CPC .... G06F 1/1626; G06F 1/1637; G06F 1/1616; G06F 1/1643; G06F 1/16; G06F 1/1613; G06F 1/1658; G06F 1/181; G06F 1/203; H05K 1/0281; H05K 5/02; H05K 5/03; H05K 5/0204; H05K 5/0217
See application file for complete search history.

(56) References Cited

U.S. PATENT DOCUMENTS

| | | | |
|---|---|---|---|
| 6,741,298 B1 | 5/2004 | Won | |
| 7,277,275 B2 | 10/2007 | Won et al. | |
| 7,558,054 B1 * | 7/2009 | Prest | H05K 5/0017 361/679.3 |
| 7,631,410 B2 | 12/2009 | Schlesener et al. | |
| 7,933,123 B2 | 4/2011 | Wang et al. | |
| 8,014,142 B2 * | 9/2011 | Prest | H05K 5/0239 361/679.3 |
| 8,144,451 B2 | 3/2012 | Rodgers et al. | |

(Continued)

FOREIGN PATENT DOCUMENTS

KR    20130065922 A  *  6/2013

OTHER PUBLICATIONS

"Display hinges", Published on: Dec. 26, 2008 Available at: http://www.laptopparts101.com/display-screen-hinges/.

(Continued)

*Primary Examiner* — Rockshana D Chowdhury
(74) *Attorney, Agent, or Firm* — Ray Quinney & Nebeker P.C.; Paul N. Taylor

(57) ABSTRACT

A connection device includes a first bracket and a second bracket. The first bracket has a base and a post with an opening therethrough and the second bracket has a base and a post with an opening therethrough. A pin is positioned through the opening of the first bracket and the opening of the second bracket to limit the movement of the first bracket relative to the second bracket in a first direction. A compressible member is positioned between at least a portion of the first bracket and at least a portion of the second bracket to limit the movement of the first bracket relative to the second bracket in a second direction.

21 Claims, 7 Drawing Sheets

(56) References Cited

U.S. PATENT DOCUMENTS

| | | | |
|---|---|---|---|
| 8,446,717 B2 | 5/2013 | Tanaka et al. | |
| 8,611,077 B2* | 12/2013 | Sanford | G06F 1/1626 |
| | | | 361/679.21 |
| 9,086,841 B1 | 7/2015 | Yu et al. | |
| 10,331,170 B2* | 6/2019 | Montevirgen | G06F 1/1637 |
| 10,545,361 B2* | 1/2020 | Song | G02F 1/133308 |
| 2003/0235320 A1* | 12/2003 | Hirschhorn | F16M 11/041 |
| | | | 381/333 |
| 2006/0125364 A1 | 6/2006 | Takeda et al. | |
| 2006/0256512 A1 | 11/2006 | Esther Kang | |
| 2008/0218954 A1 | 9/2008 | Kawano | |
| 2009/0070962 A1 | 3/2009 | Su | |
| 2011/0072619 A1 | 3/2011 | Wang et al. | |
| 2012/0050114 A1* | 3/2012 | Li | H01Q 1/24 |
| | | | 343/702 |
| 2012/0157611 A1* | 6/2012 | Katami | G02F 1/13338 |
| | | | 524/558 |
| 2012/0281381 A1 | 11/2012 | Sanford et al. | |
| 2013/0176674 A1 | 7/2013 | Brogan et al. | |
| 2014/0085796 A1* | 3/2014 | Mathew | G06F 1/1609 |
| | | | 361/679.21 |
| 2014/0376161 A1 | 12/2014 | Sung | |
| 2015/0062844 A1 | 3/2015 | Bae et al. | |
| 2015/0062969 A1 | 3/2015 | Chen et al. | |

OTHER PUBLICATIONS

"International Search Report and Written Opinion Issued in PCT Application No. PCT/US2017/047464", dated Nov. 17, 2017, 11 Pages.

* cited by examiner

SYSTEMS AND METHODS FOR DISPLAY INTEGRATION

BACKGROUND

Background and Relevant Art

Use of computing devices is becoming more ubiquitous by the day. Computing devices range from standard desktop computers to wearable computing technology and beyond. There are increasing demands and expectations on the portability and efficiency of computing devices while maintaining and/or increasing the effectiveness of displaying information to a user.

Conventional computing devices rely on a visual display, such as a light emitting diode ("LED"), organic LED, LCD, electronic ink, or other display technologies. The visual display is conventionally protected behind a cover glass that covers the visual display and provides a durable surface. In hybrid laptop and displays, the cover glass is also a writing or contact surface for a pressure and/or touch-sensitive input device. The cover glass extends beyond the visual display and is surrounded by a bezel or other border to retain the cover glass. To access the visual display and/or touch sensors, the cover glass is removable by disconnecting the bezel from a chassis of the device.

Demands on portability and compact design of electronic devices have pushed the bezels to become smaller and the visual display to be larger relative to the cover glass. Smaller bezels and less border of cover glass around the edges of the visual display compromise the durability and reworkability of the computing device.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In an embodiment, a device for securing cover glass to a chassis includes a first bracket, a second bracket, a compressible member, and a pin. The first bracket has a base and a post and an opening therethrough. The second bracket has a base and a post with an opening through the post. The compressible member is positioned between and contacting at least a portion of the first bracket and a portion of the second bracket. The pin is positioned through the opening of the first bracket and the opening of the second bracket to limit the movement of the first bracket relative to the second bracket in at least one direction.

In another embodiment, a system for displaying visual information includes a pane of cover glass, a chassis, and a first connection device. The first connection device includes a first bracket, a second bracket, and a pin. The first bracket is fixed relative to the pane of cover glass. The second bracket is fixed relative to the chassis. The first bracket has a base and a post and an opening therethrough. The second bracket has a base and a post with an opening through the post. The pin is positioned through the opening of the first bracket and the opening of the second bracket to limit the movement of the first bracket relative to the second bracket in at least one direction.

In yet another embodiment, a method of securing a visual display includes preparing a surface of a pane of cover glass with a surface tension of at least 40 dynes per square centimeter; adhering a first bracket to the surface of the pane of cover glass with a pressure sensitive adhesive; and connecting the first bracket to a second bracket with a pin through an opening in the first bracket, the second bracket being fixed relative to a chassis of the computing device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a side cross-sectional view of the embodiment of a connection device of FIG. 3 connecting a pane of cover glass to a chassis with a leaf spring, according to the present disclosure;

DETAILED DESCRIPTION

This disclosure generally relates to apparatuses, systems, and methods for securing a display in an electronic device. More particularly, this disclosure generally relates to apparatuses, systems, and methods for securing cover glass for a display in computing devices.

In some embodiments, a computing device with a display has a pane of cover glass affixed to a chassis of the computing device. The pane of cover glass may be connected to the chassis of the computing device with a connection device. The connection device may have a first bracket connected to the pane of cover glass and a second bracket connected to the chassis. The first bracket and second bracket may be connected by a pin. For example, the pin may be a set screw. The pin may limit or prevent the movement of the second bracket relative to the first bracket. The set screw may be threaded into a threaded hole in the first bracket and through an opening in the second bracket.

Figure 1:
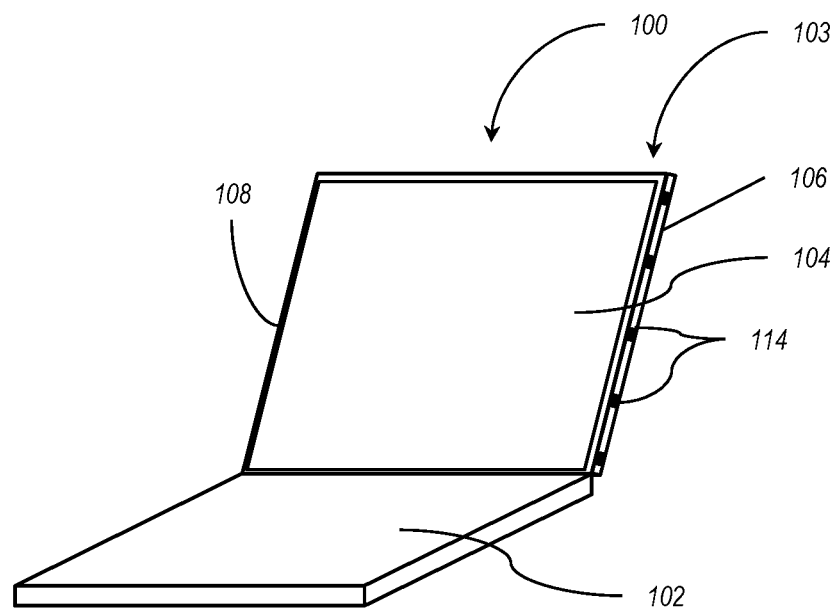
FIG. 1 is a schematic representation of an embodiment of a computing device with openings therein, according to the present disclosure.

FIG. 1 illustrates an embodiment of a computing device 100 with a first body 102 and a second body 103. The first body 102 may include one or more computing components, such as a processor, storage device, communication device, power supply, or other computing components. The second body 103 may include a visual display that is covered by a pane of cover glass 104 to protect the visual display and to retain the visual display in the second body 103. The second body 103 may be supported by a chassis 106. In some embodiments, the chassis 106 includes or is made of a rigid polymer, such as thermoplastic polyurethane (TPU); a composite, such as fiberglass; or a metal or metal alloy, such as aluminum, magnesium, iron, titanium, tin, or alloys thereof.

In other embodiments, a computing device according to the present disclosure includes computing components and a visual display with a pane of cover glass in a single body. For example, a computing device according to the present disclosure may be a tablet computer, a smartphone, a smart television, etc. In other embodiments, a computing device according to the present disclosure includes computing components and a visual display with a pane of cover glass in each of a plurality of bodies. For example, a computing device according to the present disclosure may be a hybrid computing device with a pair of touch-sensitive displays within a clamshell device. While a computing device 100 with a first body 102 and a second body 103 is described herein, the embodiment illustrated in FIG. 1 is merely illustrative.

The visual display may be in data communication with the one or more computing components and configured to display information from the one or more computing components to a user. To increase presentation of the information to the user and increase portability of the device, a bezel 108 around the perimeter of the visual display may be decreased. To decrease the bezel, the cover glass 104 may be supported by and/or connected to the chassis 106 on a rear surface of the pane of cover glass 104. To allow reworkability of the computing device 100 while concealing fasteners, the cover glass 104 and chassis 106 may be connected by one or more connection devices accessible through openings 114 in the chassis 106.

Figure 2:
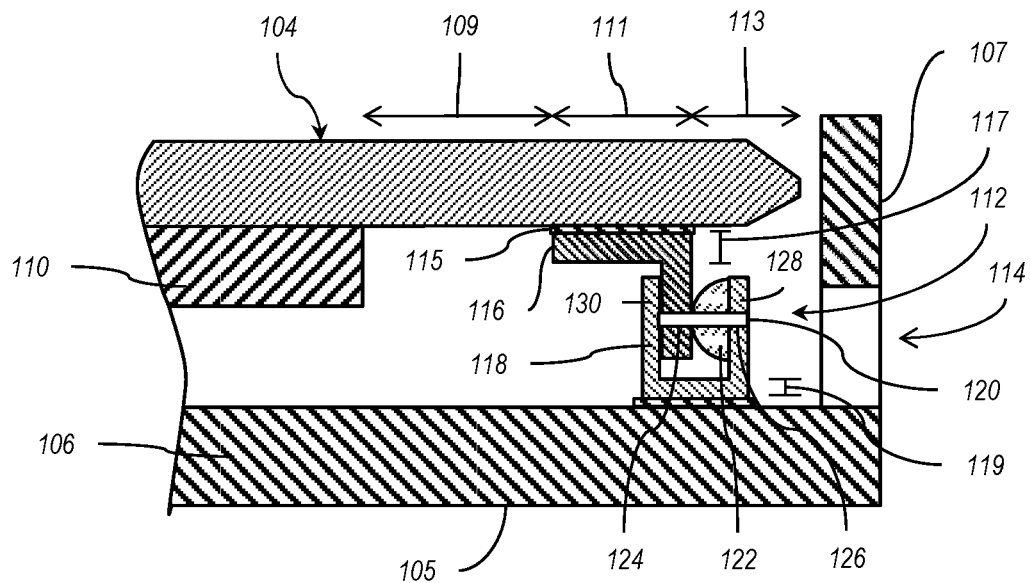
FIG. 2 is a side cross-sectional view of an embodiment of a connection device connecting a pane of cover glass to a chassis of the computing device of FIG. 1, according to the present disclosure.

As shown in FIG. 2, the visual display 110 may be positioned adjacent a rear surface of the cover glass 104. The chassis 106 of the second body of the computing device may have a base 105 and a sidewall 107. The cover glass 104 may be connected to the chassis 106 by a connection device 112. At least part of the connection device 112 may be accessible through an opening in the chassis 106, such as a side opening 114 that provides air flow between the inside and outside of the chassis 106. The side opening 114 may be sized and the connection device 112 may be positioned to allow a screwdriver or other tool to reach through the side opening 114 to apply a force to and/or move at least a portion of the connection device 112.

In some embodiments, the connection device 112 includes a first bracket 116 and a second bracket 118. The first bracket 116 is connected to the cover glass 104 and the second bracket 118 is connected to the chassis 106 by a layer of adhesive 115. In some embodiments, the first bracket 116 is affixed to the cover glass 104 using a pressure sensitive adhesive. In other embodiments, the first bracket 116 is affixed to the cover glass 104 using a liquid dispense adhesive (LDA), such as epoxies, urethanes, or other liquid adhesives. In yet other embodiments, the first bracket 116 may be affixed to the cover glass 104 using another type of adhesive, such but not limited to a laser activated adhesive or a die cut adhesive film.

In some embodiments, the second bracket 118 is affixed to the chassis 106 using a pressure sensitive adhesive. In other embodiments, the second bracket 118 is affixed to the chassis 106 using an LDA. In yet other embodiments, the second bracket 118 is affixed to the chassis 106 using another type of adhesive described herein.

In some embodiments, a surface of the cover glass 104 and/or the chassis 106 may be prepared before application of the adhesive 115. For example, the surface of the cover glass 104 and/or the chassis 106 may be cleaned using a plasma cleaner. A surface treatment with a plasma cleaner may provide a surface that allows an adhesive bond that is stronger than an unprepared surface. In some embodiments, a surface preparation may provide a contact surface with a surface energy in a range having an upper value, a lower value, or upper and lower values including any of 40 dynes per square centimeter, 45 dynes per square centimeter, 50 dynes per square centimeter, 55 dynes per square centimeter, 60 dynes per square centimeter, or any values therebetween. For example, a surface preparation may provide a contact surface with a surface energy of at least 40 dynes per square centimeter. In other embodiments, a surface preparation may provide a contact surface with a surface energy of at least 45 dynes per square centimeter. In yet other embodiments, a surface preparation may provide a contact surface with a surface energy of at least 50 dynes per square centimeter. In further embodiments, a surface preparation may provide a contact surface with a surface energy of between 40 dynes per square centimeter and 60 dynes per square centimeter. In at least one embodiment, a surface preparation may provide a contact surface with a surface energy of at least 60 dynes per square centimeter.

In some embodiments, the first bracket 116 may be spaced from the visual display 110 by a first distance 109 of at least 0.5 millimeter (mm). In other embodiments, the first bracket 116 may be spaced from the visual display 110 by a first distance 109 in a range having an upper value, a lower value, or upper and lower values including any of 0.5 mm, 0.6 mm, 0.7 mm, 0.8 mm, 0.9 mm, 1.0 mm, 1.2 mm, 1.4 mm, 1.6 mm, 1.8 mm, 2.0 mm, 2.5 mm, 3.0 mm, 4.0 mm, 5.0 mm, or any values therebetween. For example, the first distance 109 may be less than 5.0 mm. In other examples, the first distance 109 may be between 0.5 mm and 5.0 mm.

In some embodiments, the first bracket 116 and/or second bracket 118 may have a contact surface with a lateral contact length 111 in a range having an upper value, a lower value, or upper and lower values including any of 0.8 mm, 0.9 mm, 1.0 mm, 1.2 mm, 1.4 mm, 1.6 mm, 1.8 mm, 2.0 mm, 2.5 mm, 3.0 mm, 4.0 mm, 5.0 mm, or any values therebetween. For example, the lateral contact length 111 may be greater than 0.8 mm. In other examples, the lateral contact length 111 may be less than 5.0 mm. In yet other examples, the lateral contact length 111 may be between 0.8 mm and 5.0 mm. In at least one example, the lateral contact length 111 may be between 0.8 mm and 1.0 mm.

In some embodiments, the first bracket 116 may be spaced from an edge of the cover glass 104 by a second distance 113. The second distance 113 may be in a range having an upper value, a lower value, or upper and lower values including any of 0.3 mm, 0.4 mm, 0.5 mm, 0.6 mm, 0.7 mm, 0.8 mm, 0.9 mm, 1.0 mm, 1.2 mm, 1.4 mm, 1.6 mm, 1.8 mm, 2.0 mm, 2.5 mm, 3.0 mm, 4.0 mm, 5.0 mm, or any values therebetween. For example, the second distance 113 may be greater than 0.8 mm. In other examples, the second distance 113 may be less than 5.0 mm. In yet other examples, the second distance 113 may be between 0.3 mm and 5.0 mm. In at least one example, the second distance 113 may be between 0.3 mm and 1.0 mm.

In some embodiments, the first bracket 116 may have a first bracket thickness 117 in a range having an upper value, a lower value, or upper and lower values including any of 0.15 mm, 0.20 mm, 0.25 mm, 0.30 mm, 0.35 mm, 0.40 mm, 0.45 mm, 0.50 mm, 0.6 mm, 0.7 mm, 0.8 mm, 0.9 mm, 1.0 mm, or any values therebetween. For example, the first bracket thickness 117 may be greater than 0.15 mm. In other examples, the first bracket thickness 117 may be less than 1.0 mm. In yet other examples, the first bracket thickness 117 may be between 0.15 mm and 1.0 mm. In at least one example, the first bracket thickness 117 may be between 0.20 mm and 0.30 mm.

In some embodiments, the second bracket 118 may have a second bracket thickness 119 in a range having an upper value, a lower value, or upper and lower values including any of 0.15 mm, 0.20 mm, 0.25 mm, 0.30 mm, 0.35 mm, 0.40 mm, 0.45 mm, 0.50 mm, 0.6 mm, 0.7 mm, 0.8 mm, 0.9 mm, 1.0 mm, or any values therebetween. For example, the second bracket thickness 119 may be greater than 0.15 mm. In other examples, the second bracket thickness 119 may be less than 1.0 mm. In yet other examples, the second bracket thickness 119 may be between 0.15 mm and 1.0 mm. In at least one example, the second bracket thickness 119 may be between 0.20 mm and 0.30 mm.

In some embodiments, the second bracket 118 may be configured to receive at least a portion of the first bracket 116. For example, the second bracket 118 may have a base with a plurality of posts. At least a portion of the first bracket 116 may be received between a first post 128 and a second post 130 of the second bracket 118.

A pin 120 may be positioned in an opening 126 in the second bracket 118 and through an opening 124 in the first bracket 116. The pin 120 may, therefore, limit or prevent the movement of the first bracket 116 and second bracket 118 in at least a first direction (e.g., the vertical direction). For example, the pin 120 may be a set screw with a threaded surface. The threaded surface of the set screw may engage with a complimentarily threaded surface of the opening 124 in the first bracket 116. The pin 120 may be accessible from the opening 114.

In some embodiments, the pin 120 may apply a contact force to the second post 130 of the second bracket 118. In other embodiments, the connection device 112 may include a compressible member 122 that is positioned between at least a portion of the first bracket 116 and the second bracket 118. The first bracket 116 and second bracket 118 may apply a compressive force to the compressible member 122 when a portion of the first bracket 116 is received within a portion of the second bracket 118, as shown in FIG. 2. The compressible member 122 then applies an outwardly expansive force against the first bracket 116 and at least one of the posts of the second bracket 118 to limit and/or prevent movement of the first bracket 116 and second bracket 118 in at least a second direction (e.g., the horizontal direction).

Figure 3:
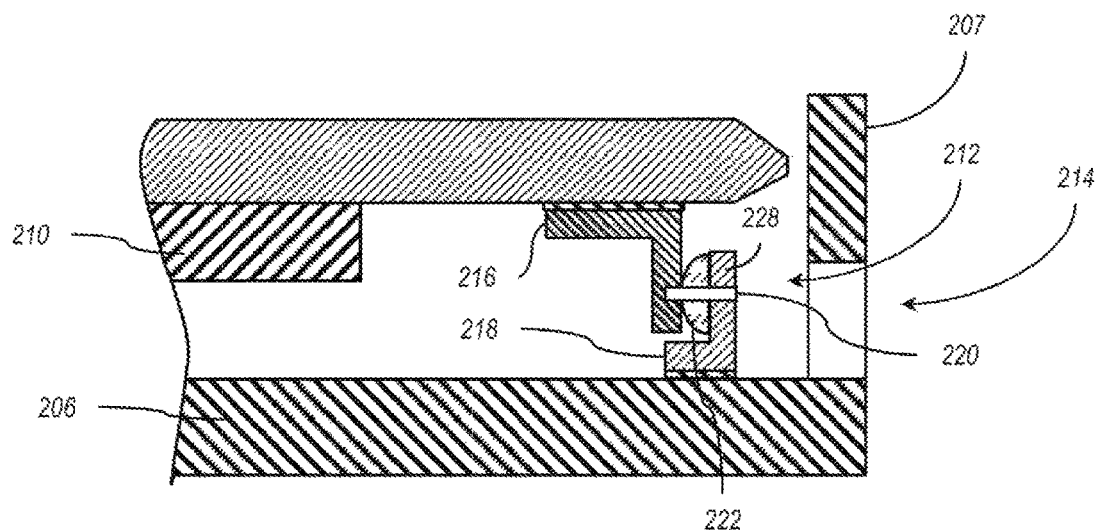
FIG. 3 is a side cross-sectional view of another embodiment of a connection device connecting a pane of cover glass to a chassis, according to the present disclosure.
Figures 1, 3:
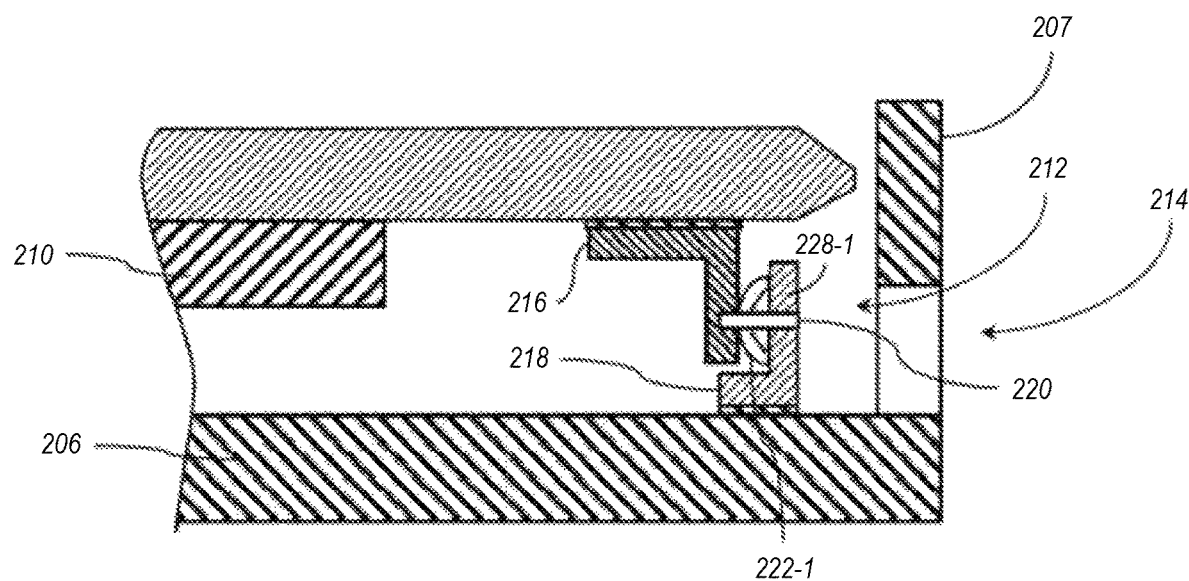

In some embodiments, the compressible member 122 may be a resilient member. For example, the compressible member 122 may be a leaf spring (e.g., as shown in FIG. 3-1), a coil spring, or other spring. In other examples, the compressible member 122 may be a compressible block. For example, the compressible member 122 may be a polymer bushing, rubber washer, gel pad, fluid pad, gas bladder, or other compressible fluid or solid.

Figure 4:
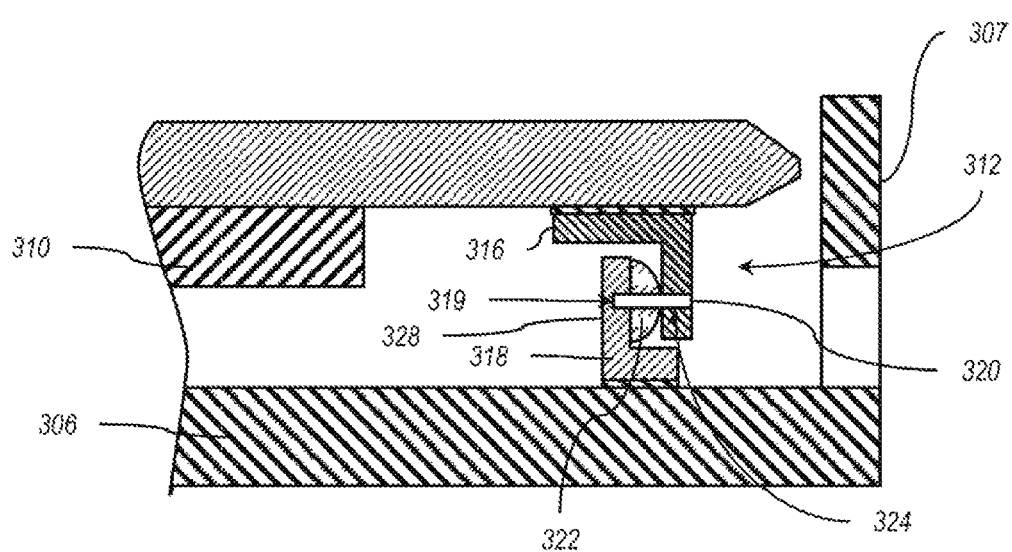
FIG. 4 is a side cross-sectional view of yet another embodiment of a connection device connecting a pane of cover glass to a chassis, according to the present disclosure.

In some embodiments, the second bracket may have a single post. As shown in FIG. 3 and FIG. 4, an embodiment of a connection device 212 may have a second bracket 218 with a single post 228 positioned vertically overlapping at least a portion of the first bracket 216. The post 228 of the second bracket 218 may be positioned outside of the first bracket 216. For example, the post 228 of the second bracket 218 in FIG. 3 is positioned between the first bracket 216 and the sidewall 207 of the chassis 206 and opposite the visual display 210.

As shown in FIG. 4, a second bracket 318 may have a single post 328 positioned vertically overlapping at least a portion of a first bracket 316. The post 328 of the second bracket 318 may be positioned inside of the first bracket 316. For example, the post 328 of the second bracket 318 in FIG. 4 is positioned between the first bracket 316 and the visual display 310 and opposite the sidewall 307 of the chassis 306.

In embodiments such as those described in relation to FIG. 3 and FIG. 4, the connection device 212, 312 includes a pin 220, 320 that is configured to limit and/or prevent the movement of the first bracket 216, 316 relative to the second bracket 218, 318 in at least a first direction. The connection device 212, 312 includes a compressible member 222, 322 positioned between at least part of the first bracket 216, 316 and at least part of the second bracket 218, 318. As shown in FIG. 3 and FIG. 4, a pin 220, 320 may pass through at least a portion of the compressible member 222, 322. In other embodiments, a pin 220, 320 may connect the first bracket 216, 316 and second bracket 218, 318 without passing through the compressible member 222, 322.

As shown in FIG. 3, the pin 220 may extend through the second bracket 218 and through the first bracket 216. In other embodiments, as shown in FIG. 4, the pin 320 may extend through only one of the first bracket 316 and the second bracket 318. For example, the pin 320 may extend through the first bracket 316 and contact the second bracket 318. The second bracket 318 may have a recess 319 therein that is configured to receive a portion of the pin 320.

In some embodiments, the recess 319 has a mechanical interlock feature on a surface thereof, such as threads, which engages with a complimentary feature on the pin 320. In other embodiments, the first bracket 318 has an opening 324 therethrough that has a mechanical interlock feature on a surface thereof, such as threads, which engages with a complimentary feature on the pin 320. In other embodiments, the recess 319 has a mechanical interlock feature on a surface thereof, such as threads, which engages with a complimentary feature on the pin 320 and the first bracket 318 has an opening 324 therethrough that has a mechanical interlock feature on a surface thereof, such as threads, which engages with a complimentary feature on the pin 320.

Figure 5:
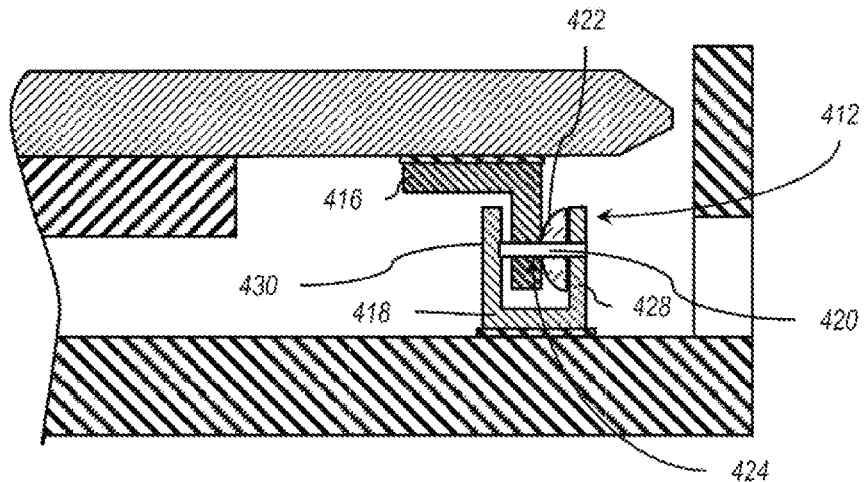
FIG. 5 is a side cross-sectional view of an embodiment of a connection device having a set screw that pushes a first bracket, according to the present disclosure.
Figure 6:
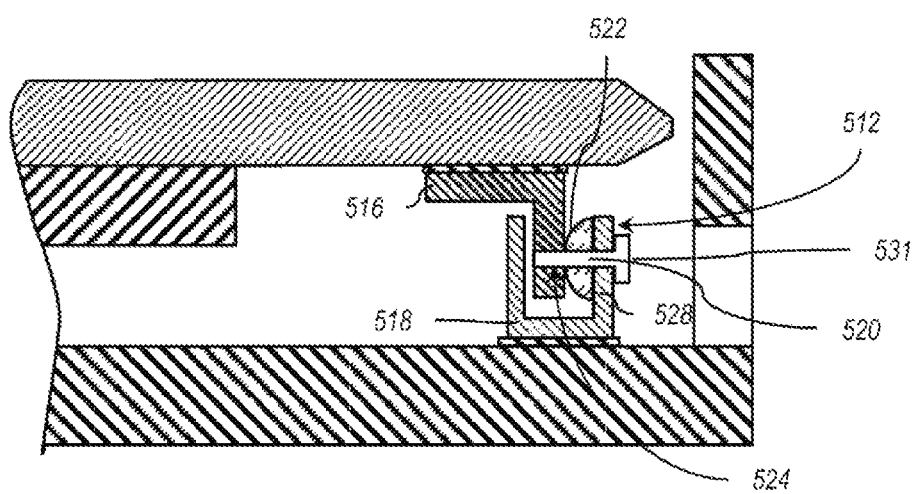
FIG. 6 is a side cross-sectional view of an embodiment of a connection device having a set screw that pulls a first bracket, according to the present disclosure.

FIG. 5 and FIG. 6 illustrate examples of the direction of force applied by the mechanical interlock feature of the pin on the first bracket and second bracket. FIG. 5 illustrates an embodiment of a connection device 412 in which a pin 420 pushes a first bracket 416 toward a post of a second bracket 418 to compress a compressible member 422. The pin 420 may have a mechanical interlock feature on a surface thereof, such as threads, which engages with a complimentary feature in an opening 424 of the first bracket 416. The pin 420 may rotate relative to the first bracket 416 and second bracket 418 to push against a second post 430 of the second bracket 418 and urge the first bracket 416 toward the first post 428 of the second bracket 418. The movement of the first bracket 416 toward the first post 428 of the second bracket 418 applies a compressive force to the compressible member 422.

FIG. 6 illustrates an embodiment of a connection device 512 in which a pin 520 pulls a first bracket 516 toward a first post 528 of a second bracket 518 to compress a compressible member 522. The pin 520 may have a mechanical interlock feature on a surface thereof, such as threads, which engages with a complimentary feature in an opening 524 of the first bracket 516. The pin 520 has a head 531 in contact with the first post 528 of the second bracket 518 and opposite the first bracket 516. The pin 520 may rotate relative to the first bracket 516 and second bracket 518 to pull the first bracket 516 toward the first post 528 of the second bracket 518. The movement of the first bracket 516 toward the first post 528 of the second bracket 518 applies a compressive force to the compressible member 522.

Figure 7:
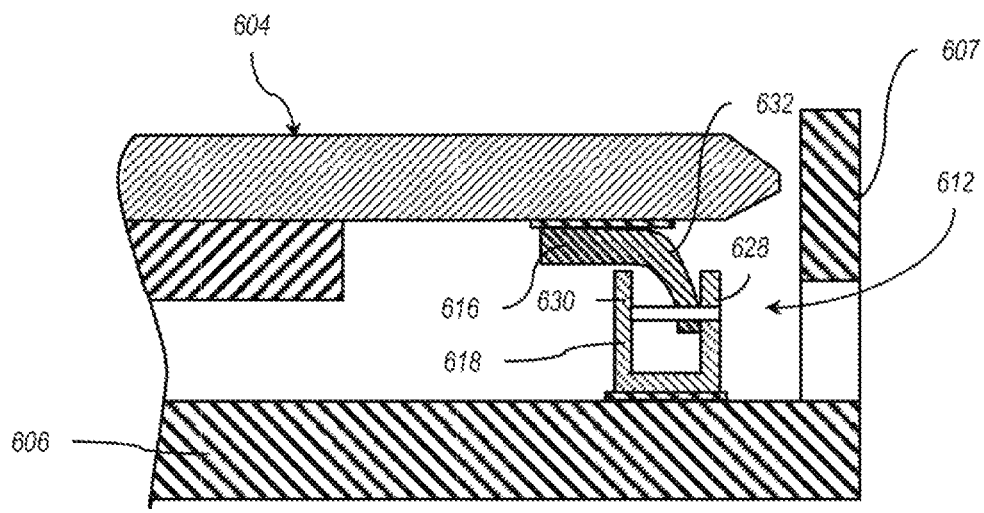
FIG. 7 is a side cross-sectional view of an embodiment of a connection device having a biased portion, according to the present disclosure.

FIG. 7 illustrates an embodiment of a connection device 612 that includes at least one bracket biased laterally to apply a compressive force within the connection device 612. The first bracket 616 includes a biased portion 632 with a curve and/or angle such that the biased portion contacts the second bracket 618 and applies a compressive force thereto. For example, the biased portion 632 may include a resilient material such that the biased portion 632 may elastically deform. The elastic deformation of the biased portion 632 may provide the compressive force between the biased portion and the second bracket 618. In some embodiments, the biased portion 632 may apply a compressive force to a first post 628 of the second bracket 618. In other embodiments, the biased portion 632 may apply a compressive force to a second post 630 of the second bracket 618. In some embodiments, the biased portion 632 may apply a compressive force toward the sidewall 607 of the chassis 606. In other embodiments, the biased portion 632 may apply a compressive force away from the sidewall 607 of the chassis 606. In at least one embodiment, a chassis 606 and a glass cover 604 may have an opposing connection device opposite the connection device 612 such that a biased portion of the opposing connection device applies a force that opposes at least a portion of the compressive force by the biased portion 632 in the connection device 612.

Figure 8:
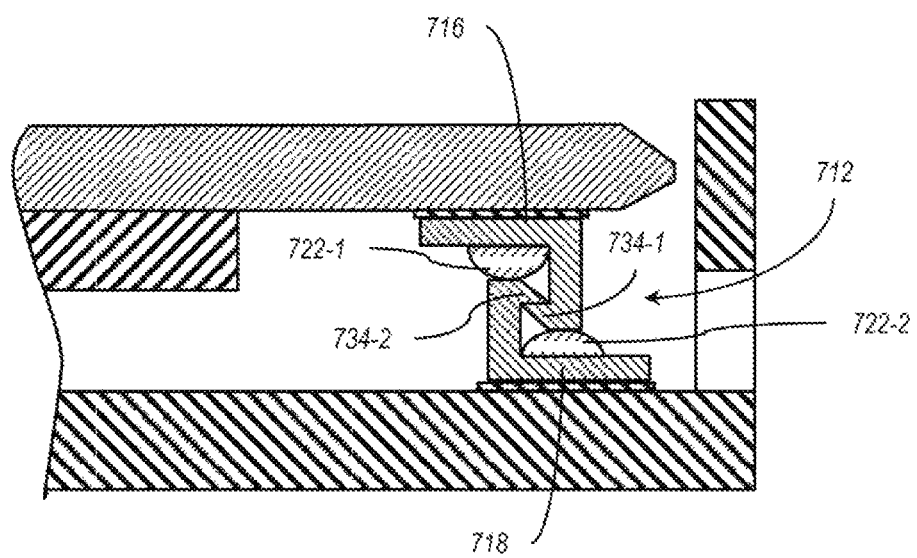
FIG. 8 is a side cross-sectional view of an embodiment of a connection device having interlocking features, according to the present disclosure.

In some embodiments, the first bracket and second bracket may include complimentary interlocking features that are configured to interlock and limit and/or prevent the movement of the first bracket and second bracket in at least one direction. For example, FIG. 8 illustrates an embodiment of a connection device 712 with a first bracket 716 and second bracket 718 mechanically interlocked.

The first bracket 716 has a first mechanical interlock feature 734-1 configured to interlock with a second mechanical interlock feature 734-2 on the second bracket 718. In some embodiments, the first bracket 716 and/or second bracket 718 may be resilient such that the first bracket 716 and/or second bracket 718 may elastically deform during assembly of the connection device 712. For example, the first bracket 716 may elastically deform as the first mechanical interlock feature 734-1 contacts the second mechanical interlock feature 734-2 of the second bracket 718, allowing the first mechanical interlock feature 734-1 to move vertically past the second mechanical interlock feature 734-2. After the first mechanical interlock feature 734-1 has moved past the second mechanical interlock feature 734-2, the first bracket 716 and second bracket 718 may be mechanically interlocked.

In some embodiments, the first bracket 716 includes a first compressible member 722-1. In other embodiments, the second bracket 718 includes a second compressible member 722-2. In yet other embodiments, the first bracket 716 and second bracket 718 include a first compressible member 722-1 and second compressible member 722-2, respectively. The second bracket 718 may contact and compress the first compressible member 722-1. The first bracket 716 may contact and compress the second compressible member 722-2. An expansive force applied by the first compressible member 722-1 and/or the second compressible member 722-2 may urge the first mechanical interlock feature 734-1 and second mechanical interlock feature 734-2 toward one another, limiting and/or preventing the movement of the first mechanical interlock feature 734-1 and second mechanical interlock feature 734-2 away from one another. Hence, the first compressible member 722-1 and/or the second compressible member 722-2 may limit and/or prevent the movement of the first bracket 716 and second bracket 718 toward one another.

Figure 9:
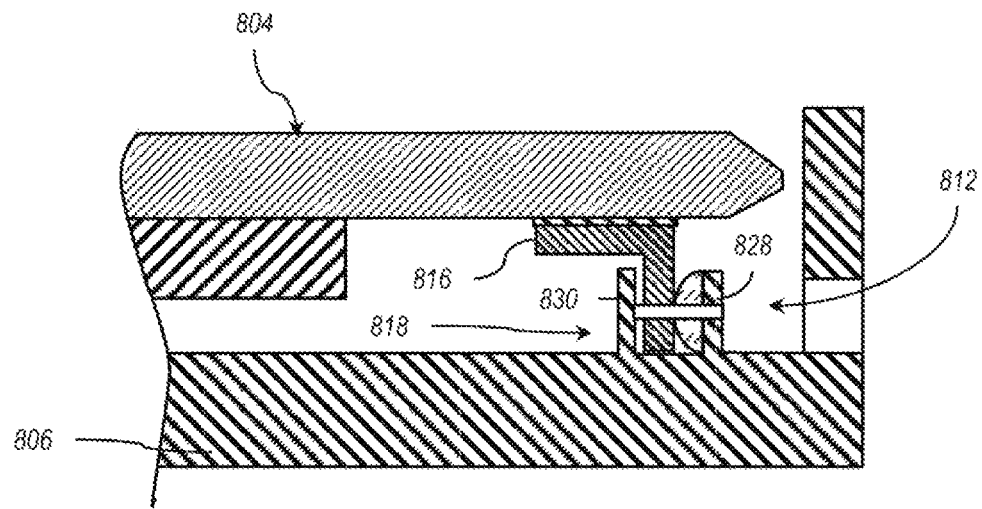
FIG. 9 is a side cross-sectional view of an embodiment of a connection device partially integrated into a chassis, according to the present disclosure.

In some embodiments, at least part of the connection device may be integrally formed with the cover glass and/or chassis. For example, FIG. 9 illustrates an embodiment of a connection device 812 with a first bracket 816 affixed to a pane of cover glass 804 and a second bracket 818 that is integrally formed with the chassis 806. In at least one example, the first post 828 and/or second post 830 may be welded to the chassis 806. In at least another example, the first post 828 and/or second post 830 may be cast with the chassis 806. In at least one other example, the first post 828 and/or second post 830 may be machined with the chassis 806. In other embodiments, the first post 828 and/or second post 830 may integrally formed with another portion of the computing device, such as a back light unit.

Figure 10:
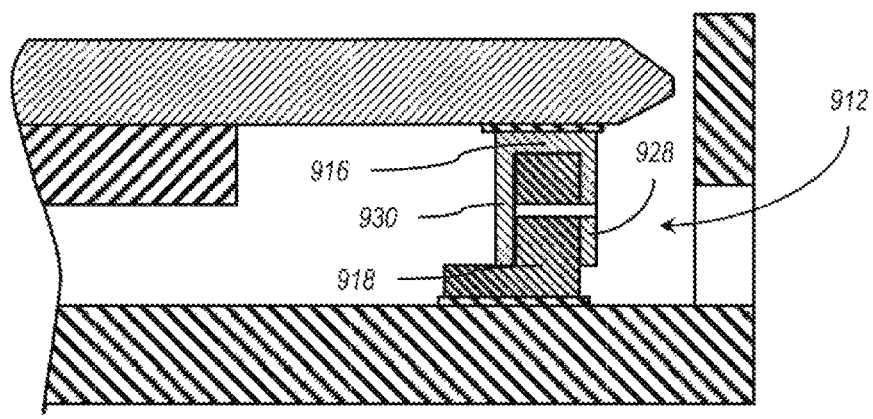
FIG. 10 is a side cross-sectional view of an embodiment of a connection device without a compressible member, according to the present disclosure.

While some of the embodiments herein are described in relation to a second bracket having a first post and a second post, it should be understood that the first bracket may, in some embodiments, have a plurality of posts. For example, FIG. 10 illustrates an embodiment of a connection device 912 with a first bracket 916 having at least a first post 928 and a second post 930. The first bracket 916 is configured to receive at least a portion of the second bracket 918 between the first post 928 and the second post 930.

Further, FIG. 10 illustrates a first bracket 916 that is configured to limit movement of a second bracket 918 in the direction of the pin. For example, the first post 928 and second post 930 are configured to both be adjacent to the second bracket 918 at the same time, such that the second bracket 918 is retained in place without a compressible member.

A computing device, such as computing device 100 shown in FIG. 1 may include a plurality of connection devices positioned around a periphery of the cover glass. In some embodiments, all of the connection members of the plurality of connection members are the same. For example, a computing device may have a plurality of connection devices such as the connection device 112 described in relation to FIG. 2. In other examples, a computing device may have a plurality of connection devices such as the connection device 412 described in relation to FIG. 5. In other embodiments, at least one of the connection devices of the plurality of connection devices is different from the other connection device of the plurality of connection devices. For example, a computing device may have at least one connection device similar to the connection device 312 described in relation to FIG. 4 and at least one connection device similar to connection device 612 described in relation to FIG. 7.

Figure 11:
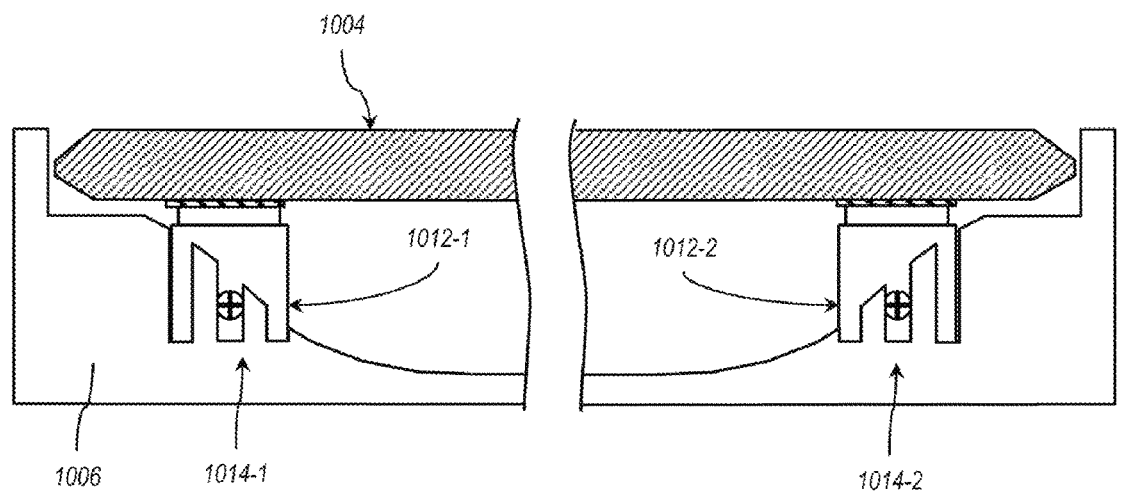
FIG. 11 is a side cross-sectional view of an embodiment of a computing device with a plurality of connection devices positioned on the same edge of the cover glass, according to the present disclosure.

In some embodiments, a computing device may have a plurality of connection devices positioned laterally on the same side of the chassis. For example, FIG. 11 illustrates an embodiment of a cover glass 1004 and chassis 1006 coupled by a first connection device 1012-1 and a second connection device 1012-2 positioned on the same side of the chassis 1006. The first connection device 1012-1 may be accessible through a first opening 1014-1 in the chassis 1006 and the second connection device 1012-2 may be accessible through a second opening 1014-2 in the chassis 1006.

Figure 12:
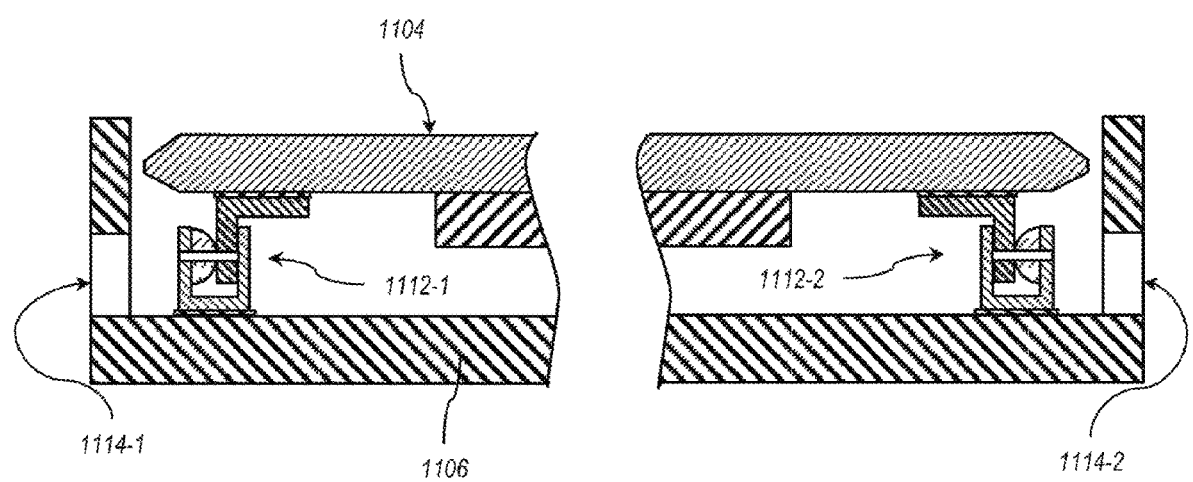
FIG. 12 is a side cross-sectional view of an embodiment of a computing device with a plurality of connection devices positioned on the opposite edge of the cover glass, according to the present disclosure.

In other embodiments, a computing device may have a plurality of connection devices positioned opposing one another on opposite sides of the chassis. For example, FIG. 12 illustrates an embodiment of a cover glass 1104 and chassis 1106 coupled by a first connection device 1112-1 and a second connection device 1112-2 positioned on opposite sides of the chassis 1106. The first connection device 1112-1 may be accessible through a first opening 1114-1 in the chassis 1106 and the second connection device 1112-2 may be accessible through a second opening 1114-2 in the chassis 1106.

One or more components of the embodiments described herein may be provided in a kit. For example, the computing device 100 of FIG. 1 may be provided with the connection device of FIG. 6. In other examples, the first bracket 716 and second bracket 718 of FIG. 8 may be provided with the pin 520 of FIG. 6.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A visual display system for securing a pane of cover glass to a chassis, the system comprising:
  a first connection device configured to selectively connect the pane of cover glass to the chassis, the first connection device including,
    a first bracket directly connected to the pane of cover glass, the first bracket having a base and a post, the first bracket having an opening;
    a second bracket connected to the chassis, the second bracket having a base and a post, the second bracket having an opening therethrough;
    a compressible member positioned between and contacting at least a portion of the first bracket and at least a portion of the second bracket, wherein the compressible member applies an outwardly expansive force against the first bracket and the second bracket; and
    a pin positioned within the opening in the first bracket and within the opening in the second bracket to limit movement of the first bracket and second bracket relative to one another in at least one direction; and a second connection device configured to selectively connect the pane of cover glass to the chassis, the second connection device including:
  a first bracket fixed relative to the pane of cover glass, the first bracket having an opening therethrough;
  a second bracket fixed relative to the chassis, the second bracket having an opening therethrough; and
  a pin positioned within the opening in the first bracket and within the opening in the second bracket to limit movement of the first bracket and second bracket relative to one another in at least one direction.

2. The system of claim 1, wherein the second bracket has a first post and a second post and the second bracket receives at least a portion of the first bracket between the first post and the second post of the second bracket.

3. The system of claim 1, wherein the pin is a set screw.

4. The system of claim 3, wherein the set screw engages with a complimentarily threaded surface on the first bracket.

5. The system of claim 3, wherein the set screw engages with a complimentarily threaded surface on the second bracket.

6. The system of claim 1, wherein the first bracket includes a biased portion to apply a force to the second bracket.

7. The system of claim 1, wherein the first bracket is directly connected to the pin, the pane of cover glass, and the compressible member, and wherein the second bracket is directly connected to the pin, the chassis, and the compressible member.

8. A visual display system, the system comprising:
  a visual display;
  a pane of cover glass positioned exterior to the visual display to protect the visual display;
  a chassis;
  a first connection device configured to selectively connect the pane of cover glass to the chassis, the first connection device including,
    a first bracket directly affixed to a lower surface of the pane of cover glass, the first bracket having an opening therethrough;
    a second bracket fixed relative to the chassis, the second bracket having an opening therethrough;
    a pin positioned within the opening in the first bracket and within the opening in the second bracket to limit movement of the first bracket and second bracket relative to one another in at least one direction; and
    a compressible member positioned between and contacting at least a portion of the first bracket and at least a portion of the second bracket.

9. The system of claim 8, further comprising a second connection device configured to selectively connect the pane of cover glass to the chassis, the second connection device including:
  a first bracket fixed relative to the pane of cover glass, the first bracket having an opening therethrough;
  a second bracket fixed relative to the chassis, the second bracket having an opening therethrough; and
  a pin positioned within the opening in the first bracket and within the opening in the second bracket to limit movement of the first bracket and second bracket relative to one another in at least one direction.

10. The system of claim 9, wherein the second connection device is positioned on an opposing edge of the pane of cover glass.

11. The system of claim 9, wherein the first connection device and the second connection device are positioned on the same edge of the pane of cover glass.

12. The system of claim 8, wherein the chassis includes an opening, the pin of the first connection device being accessible through the opening from an exterior of the chassis.

13. The system of claim 8, wherein the first bracket is fixed relative to the pane of cover glass with a pressure sensitive adhesive.

14. The system of claim 8, wherein the first bracket is fixed relative to the pane of cover glass at a contact surface with a lateral contact length in a range of 0.8 millimeters to 5.0 millimeters.

15. The system of claim 8, wherein the first bracket has a first bracket thickness in a range of 0.15 millimeters to 1.0 millimeters.

16. The system of claim 8, wherein the second bracket is directly fixed to the chassis with a pressure sensitive adhesive.

17. The system of claim 8, wherein the second bracket is integrally formed with the chassis.

18. The system of claim 8, wherein the cover glass extends laterally beyond the visual display.

19. The system of claim 8, wherein the first connection selectively connects the pane of cover glass to the chassis such that at least one edge of the pane of cover glass is adjacent to a sidewall of the chassis to space the cover glass from the sidewall of the chassis.

20. A method of securing a visual display system in a computing device, the method comprising:
  preparing a surface of a pane of cover glass with a surface tension of at least $40*10^{-5}$ N per square centimeter;
  directly adhering a first bracket to the surface of the pane of cover glass with a pressure sensitive adhesive directly applied between the first bracket and the surface of the pane;
  positioning the pane of cover glass above a visual display; and
  after positioning the pane of cover glass, connecting the first bracket to a second bracket with a pin within an opening in the first bracket, the second bracket being fixed relative to a chassis of the computing device, wherein connecting the first bracket to the second bracket applies a compressive force to a compressible member, and applying the compressive force to the compressible member applies an expansive force to the first bracket and the second bracket.

21. The method of claim 20, wherein preparing the surface includes cleaning the surface with a plasma cleaner to provide the surface with a surface tension of at least $60*10^{-5}$ N per square centimeter.

* * * * *